(12) United States Patent
Chen et al.

(10) Patent No.: US 11,735,617 B2
(45) Date of Patent: Aug. 22, 2023

(54) SEMICONDUCTOR STRUCTURE, BACK-SIDE ILLUMINATED IMAGE SENSOR AND METHOD FOR MANUFACTURING THE SAME

(71) Applicant: TAIWAN SEMICONDUCTOR MANUFACTURING COMPANY LTD., Hsinchu (TW)

(72) Inventors: Sheng-Chau Chen, Tainan (TW); Cheng-Hsien Chou, Tainan (TW); Min-Feng Kao, Chiayi (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 93 days.

(21) Appl. No.: 17/236,948

(22) Filed: Apr. 21, 2021

(65) Prior Publication Data
US 2021/0242252 A1    Aug. 5, 2021

Related U.S. Application Data

(60) Continuation of application No. 16/847,331, filed on Apr. 13, 2020, now Pat. No. 11,011,568, which is a continuation of application No. 16/404,436, filed on May 6, 2019, now Pat. No. 10,622,401, which is a division of application No. 15/471,543, filed on Mar. 28, 2017, now Pat. No. 10,283,550.

(51) Int. Cl.
*H01L 27/146*    (2006.01)

(52) U.S. Cl.
CPC ...... *H01L 27/1464* (2013.01); *H01L 27/1462* (2013.01); *H01L 27/1463* (2013.01); *H01L 27/14609* (2013.01); *H01L 27/14621* (2013.01); *H01L 27/14627* (2013.01); *H01L 27/14636* (2013.01); *H01L 27/14643* (2013.01); *H01L 27/14685* (2013.01)

(58) Field of Classification Search
CPC .................................................. H01L 27/146
See application file for complete search history.

(56) References Cited

U.S. PATENT DOCUMENTS

| | | | |
|---|---|---|---|
| 9,773,831 B1* | 9/2017 | Yang | H01L 27/14621 |
| 2011/0133339 A1* | 6/2011 | Wang | H01L 23/481 |
| | | | 257/773 |

(Continued)

*Primary Examiner* — Mounir S Amer
(74) *Attorney, Agent, or Firm* — WPAT Law; Anthony King

(57) ABSTRACT

A semiconductor structure includes: a semiconductor substrate arranged over a back end of line (BEOL) metallization stack, and including a scribe line opening; a conductive pad having an upper surface that is substantially flush with an upper surface of the semiconductor substrate, the conductive pad including an upper conductive region and a lower conductive region, the upper conductive region being confined to the scribe line opening substantially from the upper surface of the semiconductor substrate to a bottom of the scribe line opening, and the lower conductive region protruding downward from the upper conductive region, through the BEOL metallization stack; a passivation layer arranged over the semiconductor substrate; and an array of pixel sensors arranged in the semiconductor substrate adjacent to the conductive pad.

20 Claims, 9 Drawing Sheets

(56) References Cited

U.S. PATENT DOCUMENTS

| 2015/0129942 | A1* | 5/2015 | Kao | H01L 27/1463 |
| | | | | 257/292 |
| 2015/0179612 | A1* | 6/2015 | Tsai | H01L 24/24 |
| | | | | 257/773 |
| 2016/0260756 | A1* | 9/2016 | Yamagishi | H01L 27/14643 |
| 2017/0141146 | A1* | 5/2017 | Belsher | H01L 27/14632 |

* cited by examiner

SEMICONDUCTOR STRUCTURE, BACK-SIDE ILLUMINATED IMAGE SENSOR AND METHOD FOR MANUFACTURING THE SAME

CROSS REFERENCE TO RELATED APPLICATIONS

This application is a continuation of application Ser. No. 16/847,331, filed on Apr. 13, 2020, which is a continuation of application Ser. No. 16/404,436, filed on May 6, 2019, which is a division of application Ser. No. 15/471,543, filed on Mar. 28, 2017, which is incorporated by reference in its entirety.

BACKGROUND

Many modern day electronic devices include optical imaging devices (e.g., digital cameras) that use image sensors. Image sensors convert optical images to digital data that may represent the images. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) complementary metal-oxide-semiconductor (CMOS) image sensor. BSI CMOS image sensors advantageously have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
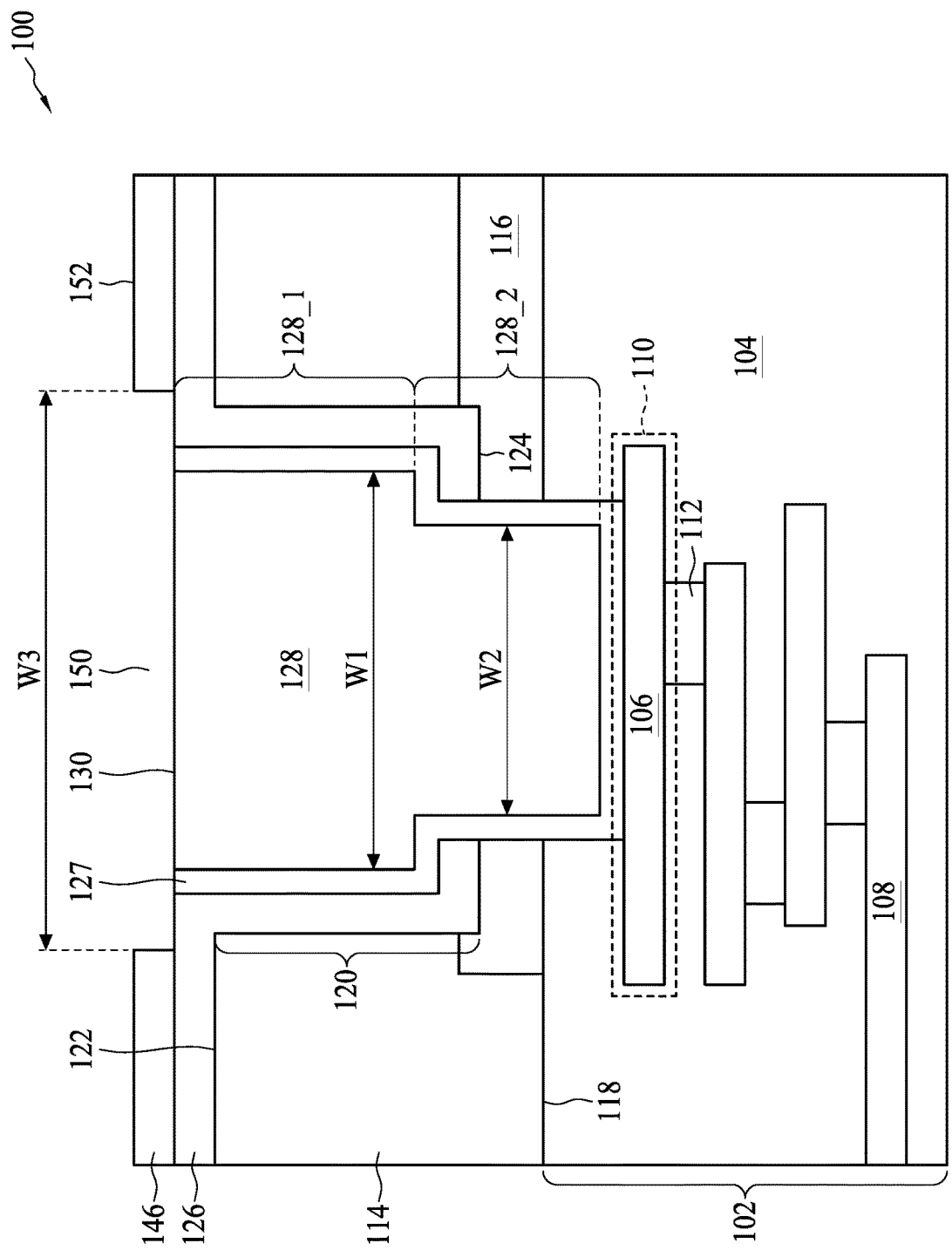
FIG. 1 is a cross-sectional view of a semiconductor structure having a flat pad structure in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Complementary metal-oxide-semiconductor (CMOS) image sensors include an array of pixels sensors arranged within a semiconductor substrate of an integrated circuit (IC). Further, some CMOS image sensors include an array of color filters arranged over the pixel sensor array, and buried within a light-receiving side of the IC. Burying the color filter array within the integrated circuit advantageously improves optical performance. For example, one or more of cross talk, quantum efficiency, and SNR-X (i.e., minimum luminance to achieve a signal-to-noise ratio (SNR) of X, such as 10) may be improved. While burying the color filter array provides improved optical performance, integrating the buried color filter array (BCFA) process with existing CMOS image sensor processes during manufacture poses challenges. For example, some methods for manufacturing the CMOS image sensors with the BCFA, form a passivation layer on the light-receiving side of the IC. Pads are then formed laterally surrounding the pixel sensor array, in a scribe line opening on the light-receiving side of the IC. With the pads formed, the BCFA is formed at a location buried in the passivation layer, according to the BCFA process.

A limitation of the BCFA process is that it is dependent upon the light-receiving side of the IC having a surface that is substantially planar (e.g., flat). Failure to have a substantially planar surface may negatively affect optical performance. However, the scribe line opening creates discontinuities on the surface of the light-receiving side. One approach for addressing this limitation is to fill the scribe line opening with a dielectric layer, and to perform a chemical mechanical polish (CMP), before performing the BCFA process. While the dielectric filling approach leads to a substantially planar surface on the light-receiving side of the IC, it may also damage the passivation layer (e.g., with the CMP). Such damage may negatively affect the optical performance gains from the BCFA.

In view of the foregoing, the present application is directed to a method for integrating a pad process with a BCFA process during the manufacture of an image sensor so as to eliminate passivation layer damage caused by the pad process. According to some embodiments of the method, a pad is formed within a scribe line opening on a light-receiving side of an IC. A planarization process is performed causing the pad to have an upper surface that is substantially planar and even with a neighboring surface of the IC. With the flat pad structure formed, a passivation layer is formed on the light-receiving surface of the IC, and a BCFA or another structure is formed on the light-receiving surface. By forming the passivation layer after forming the flat pad structure, passivation layer damage due to the pad and dielectric layer formation is advantageously eliminated (e.g., since the passivation layer is not formed until after the pad and dielectric layer formation). Further, by eliminating the passivation layer damage, optical performance is advantageously improved and subsequent structures that are dependent upon the passivation layer may be formed without problem or performance degradation.

With reference to FIG. 1, a cross-sectional view 100 of some embodiments of a semiconductor structure having a flat pad structure is provided. The flat pad structure includes a BEOL metallization stack 102. The BEOL metallization stack 102 includes an interlayer dielectric (ILD) layer 104 and metallization layers 106, 108 stacked within the ILD layer 104. The ILD layer 104 may be, for example, a low k dielectric (i.e., a dielectric with a dielectric constant less than about 3.9) or an oxide. The metallization layers 106, 108 include a lower metallization layer 108 and an upper metallization layer 106 with a metal line 110. The metallization layers 106 and 108 are electrically coupled to one another by vias 112 of the BEOL metallization stack 102. The metallization layers 106, 108, the vias 112, and the metal line 110 may be, for example, a metal, such as aluminum copper, aluminum, germanium, copper, or some other metal.

A semiconductor substrate 114 and an isolation region 116 are arranged over the BEOL metallization stack 102. The semiconductor substrate 114 and the isolation region 116 both abut an upper surface 118 of the BEOL metallization stack 102, and the isolation region 116 extends vertically therefrom into the semiconductor substrate 114. The semiconductor substrate 114 may be, for example, a bulk semiconductor substrate, such as a bulk silicon substrate, or a silicon-on-insulator (SOI) substrate. The isolation region 116 may be, for example, a shallow trench isolation (STI) region or an implant isolation region.

A scribe line opening 120 is arranged in the semiconductor substrate 114 and, in some embodiments, the isolation region 116. The scribe line opening 120 is defined vertically between an upper surface 122 of the semiconductor substrate 114 and a surface 124 that is recessed below the upper surface 122. The recessed surface 124 may be that of the semiconductor substrate 114 and/or that of the isolation region 116. Further, although not visible, the scribe line opening 120 typically extends laterally around a pixel sensor array, whereby it typically has footprint with a central void corresponding to the pixel sensor array.

A buffer layer 126 lines the scribe line opening 120 and the upper surface 122. The buffer layer 126 includes a first region lining a recessed surface 124 of the scribe line opening 120 directly under the pad 128, a second region lining sidewall surfaces of the scribe line opening 120, and a third region lining the upper surface 122. In some embodiments, the first, second, and third regions have substantially uniform thicknesses. The buffer layer 126 may be, for example, a dielectric, such as silicon dioxide or some other oxide.

The pad 128 is conductive and may be, for example, a metal, such as copper. The pad 128 includes an upper conductive region 128_1 and a lower conductive region 128_2 underlying the upper conductive region 128_1. The upper conductive region 128_1 of the pad 128 is confined to the scribe line opening 120 substantially from the upper surface 122 of the semiconductor substrate 114 (the thickness of the buffer layer may be omitted) to a bottom of the scribe line opening with a constant width. The lower conductive region 128_2 of the pad 128 protrudes downward from the upper conductive region 128_1 of the pad 128, through the buffer layer 126, the isolation region 116, and the ILD layer 104, to the metal line 110. A width W1 of the upper conductive region 128_1 of the pad 128 is wider than a width W2 of the lower conductive region 128_2 of the pad 128, and the upper conductive region 128_1 of the pad 128 is centered on a center of the lower conductive region 128_2 of the pad 128. In some embodiments, the upper conductive region 128_1 of the pad 128 has a width narrower or equal to that of the lower conductive region 128_2 of the pad 128. In some embodiments, a center of the upper conductive region 128_1 of the pad 128 is offset from the center of the lower conductive region 128_2 of the pad 128. A barrier layer 127 may be conformally formed to surround sidewalls and a bottom of the pad 128, except an upper surface 130 of the barrier layer 127. The barrier layer 127 may include at least one layer of TaN, TiN, WN, TbN, VN, ZrN, CrN, WC, WN, WCN, NbN, AlN, or combinations thereof.

A passivation layer 146 is arranged over the semiconductor substrate 114, and lines over an upper surface of the buffer layer 126. In some embodiments, the passivation layer 146 may be, for example, a single or multilayer dielectric film including one or more layers of: oxide, such as silicon dioxide; nitride, such as silicon nitride; and high k dielectric (i.e., dielectric with a dielectric constant greater than about 3.9). In some embodiments, the passivation layer 146 includes a nitride layer arranged over a pair of oxide layers, which are stacked on opposing sides of a high k dielectric layer. In other embodiments, the passivation layer 146 includes a nitride layer arranged over an oxide layer.

A pad opening 150 is arranged in the passivation layer 146, over the pad 128. The pad opening 150 is defined vertically between an upper surface 152 of the passivation layer 146 and the upper surface 130 of the pad 128 that is recessed below the upper surface 152. A width W3 of the pad opening 150 may be greater than that of the pad 128. The pad opening 150 exposes the upper surface 130 of the pad 128, thereby allowing an electrical connection to be formed with the pad 128 through the pad opening 150. In some embodiments, the width W3 of the pad opening 150 is the same or less than that of the pad 128.

Figure 2:
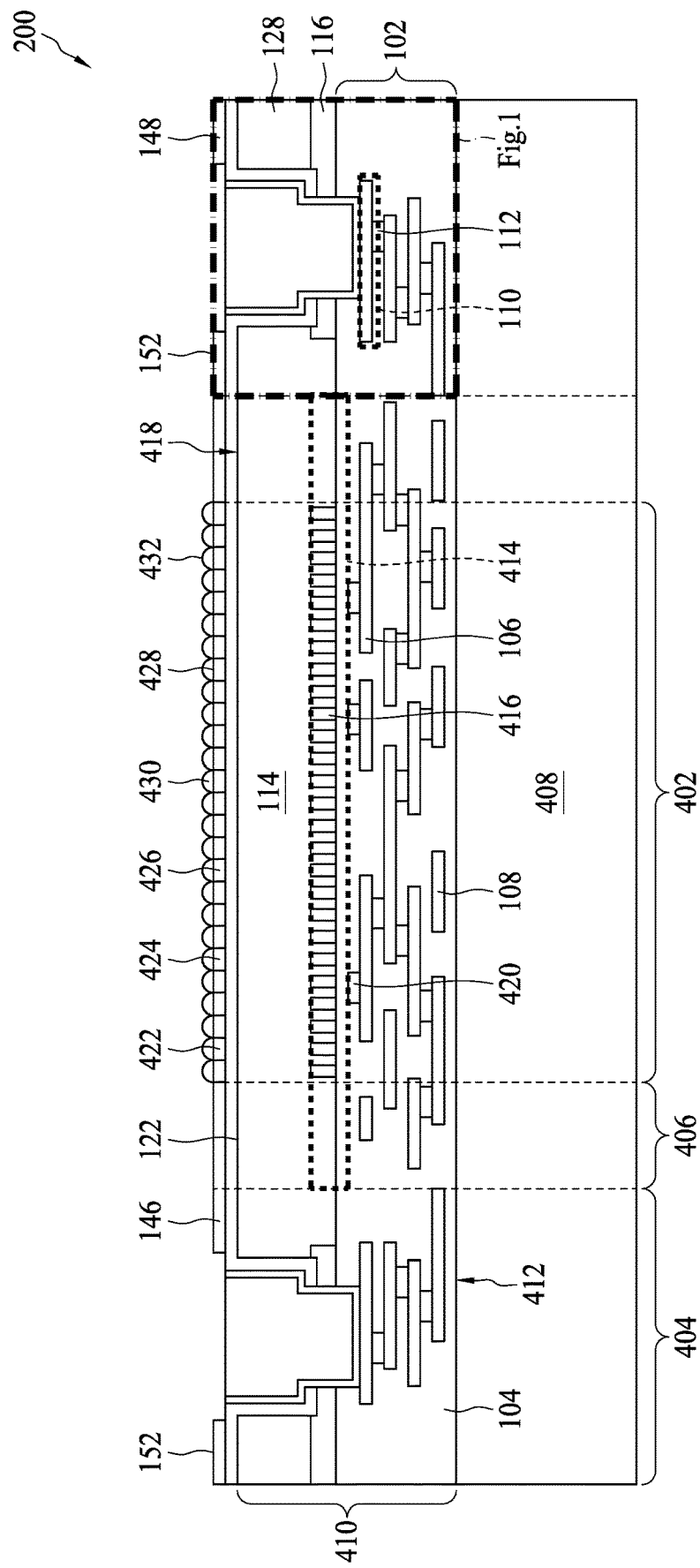
FIG. 2 is a cross-sectional view of a back-side illuminated (BSI) image sensor within which the flat pad structure of FIG. 1 finds application in accordance with an exemplary embodiment of the present disclosure.

With reference to FIG. 2, a cross-sectional view 200 of some embodiments of a back-side illuminated (BSI) image sensor within which the flat pad structure finds application is provided. The BSI image sensor includes a sensing region 402, an interconnect region 404, and a logic region 406. The sensing region 402 is arranged at a center of the BSI image sensor, and is configured to sense incident radiation. The interconnect region 404 laterally surrounds the sensing region 402 along an edge of the BSI image sensor, and includes flat pad structures according to FIG. 1 (illustrated with FIG. 1). The flat pad structures are laterally spaced around the sensing region 402, and are configured to connect the BSI image sensor to external devices. The logic region 406 laterally surrounds the sensing region 402 between the sensing region 402 and the interconnect region 404, and includes logic devices (not shown) configured to support operation of the BSI image sensor.

The sensing, interconnect, and logic regions 402, 404, 406 are arranged within a first integrated circuit 410. The first integrated circuit 410 is vertically stacked and bonded onto a second integrated circuit 408 in a face-to-face configuration, such that the BEOL metallization stack 102 abuts an inter-layer dielectric (ILD) layer (not shown) of the second integrated circuit 408. The ILD layer of the second integrated circuit 408 includes one or more metal interconnect layers. The first integrated circuit 410 includes a device region 414 arranged between a semiconductor substrate 114 and a BEOL metallization stack 102. The device region 414 includes electronic components, such as, for example, one or more of transistors, capacitors, resistors, inductors, photodetectors, and photodiodes. Within the sensing region 402, the device region 414 typically includes an array of pixel sensors 416, such as photodetectors and/or photodiodes. Within the logic region 406, the device region 414 typically includes transistors (not shown).

The semiconductor substrate 114 and the BEOL metallization stack 102 are stacked on opposing sides of the device region 414. The semiconductor substrate 114 is arranged along a back side 418 of the first integrated circuit 410, opposite the front side 412. The BEOL metallization stack 102 is arranged along the front side 412 of the first integrated circuit 410, and includes an ILD layer 104 and metallization layers 106, 108 stacked within the ILD layer 104. Contacts 420 electrically couple the device region 414 to the metallization layers 106, 108, and vias 112 electrically couple the metallization layers 106, 108 to one another. The metallization layers 106, 108, the contacts 420, and the vias 112 may be, for example, a conductive material, such as aluminum copper, germanium, copper, or some other metal. The first integrated circuit 410 may be coupled to the second integrated circuit 408 through a through oxide via (TOV), or a contact neighboring to the front side 412 within the ILD layer 104.

A passivation layer 146 is arranged over an upper surface 122 of the semiconductor substrate 114 along the back side 418 of the first integrated circuit 410. Further, in some embodiments, a metal connect layer (not shown) is arranged over and lining the passivation layer 146. An array of color filters 422, 424, 426 is buried in the passivation layer 146, within the sensing region 402. Typically, the color filters 422, 424, 426 have planar upper surfaces 428 that are approximately coplanar with an upper surface 152 of the passivation layer 146. The color filters 422, 424, 426 correspond to the pixel sensors 416 and are assigned corresponding colors or wavelengths of radiation (e.g., light). Further, the color filters 422, 424, 426 are configured to transmit the assigned colors or wavelengths of radiation to the corresponding pixel sensors 416. Typically, the color filter assignments alternate between red, green, and blue, such that the color filters 422, 424, 426 include blue color filters 422, red color filters 424, and green color filters 426. In some embodiments, the color filter assignments alternative between red, green, and blue light according to a Bayer mosaic.

An array of micro lenses 430 is arranged over the color filters 422, 424, 426 and the pixel sensors 416. The micro lenses 430 correspond to the pixel sensors 416, and have centers that are typically aligned with centers of the color filters 422, 424, 426 and/or centers of the pixel sensors 416. The micro lenses 430 are configured to focus incident radiation towards the pixel sensors 416 and/or the color filters 422, 424, 426. In some embodiments, the micro lenses 430 have convex upper surfaces 432 configured to focus radiation towards the pixel sensors 416 and/or the color filters 422, 424, 426.

With reference to FIGS. 3-9, cross-sectional views of some embodiments of a semiconductor structure having a flat pad structure at various stages of manufacture are provided to illustrate a method. Although FIGS. 3-9 are described in relation to the method, it will be appreciated that the structures disclosed in FIGS. 3-9 are not limited to the method, but instead may stand alone as structures independent of the method. Similarly, although the method is described in relation to FIGS. 3-9, it will be appreciated that the method is not limited to the structures disclosed in FIGS. 3-9, but instead may stand alone independent of the structures disclosed in FIGS. 3-9.

While the disclosed method is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 3:
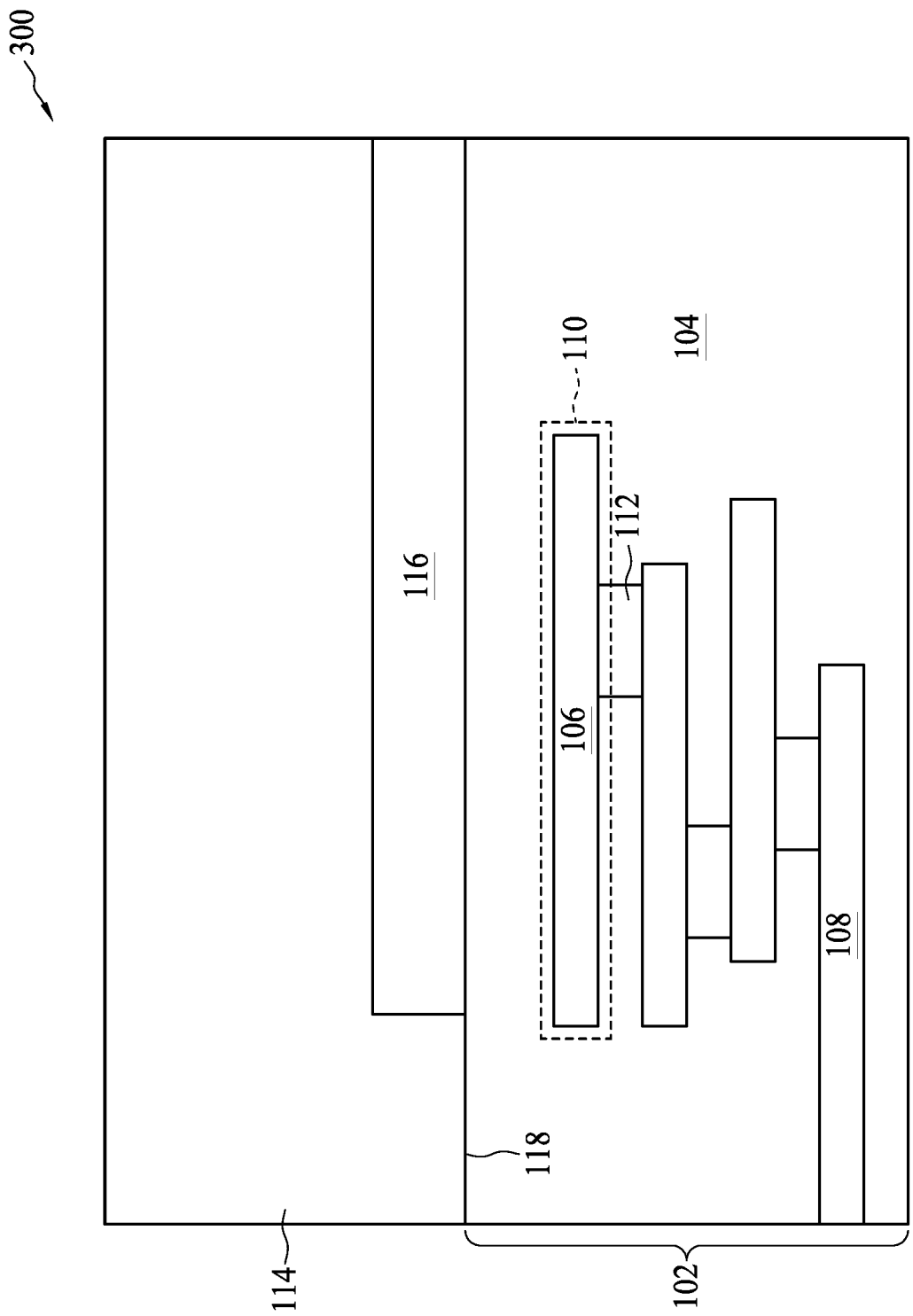
FIG. 3 to FIG. 9 are cross-sectional views of a semiconductor structure fabricated at various stages, in accordance with an exemplary embodiment of the present disclosure.

As illustrated in FIG. 3, a semiconductor substrate 114 and an isolation region 116 arranged over and abutting a BEOL metallization stack 102 are provided. The semiconductor substrate 114 and the isolation region 116 both abut an upper surface 118 of the BEOL metallization stack 102, laterally adjacent to one another, and the isolation region 116 extends vertically from the upper surface 118 into the semiconductor substrate 114. The semiconductor substrate 114 may be, for example, a bulk silicon substrate. The isolation region 116 may be, for example, an STI region. The BEOL metallization stack 102 includes an ILD layer 104 and metallization layers 106, 108 stacked within the ILD layer 104. The metallization layers 106, 108 include an upper metallization layer 106 with a metal line 110, and are electrically coupled to one another by vias 112. The ILD layer 104 may be, for example, a low k dielectric or an oxide. The metallization layers 106, 108, the vias 112, and the metal line 110 may be, for example, a metal.

Figure 4:
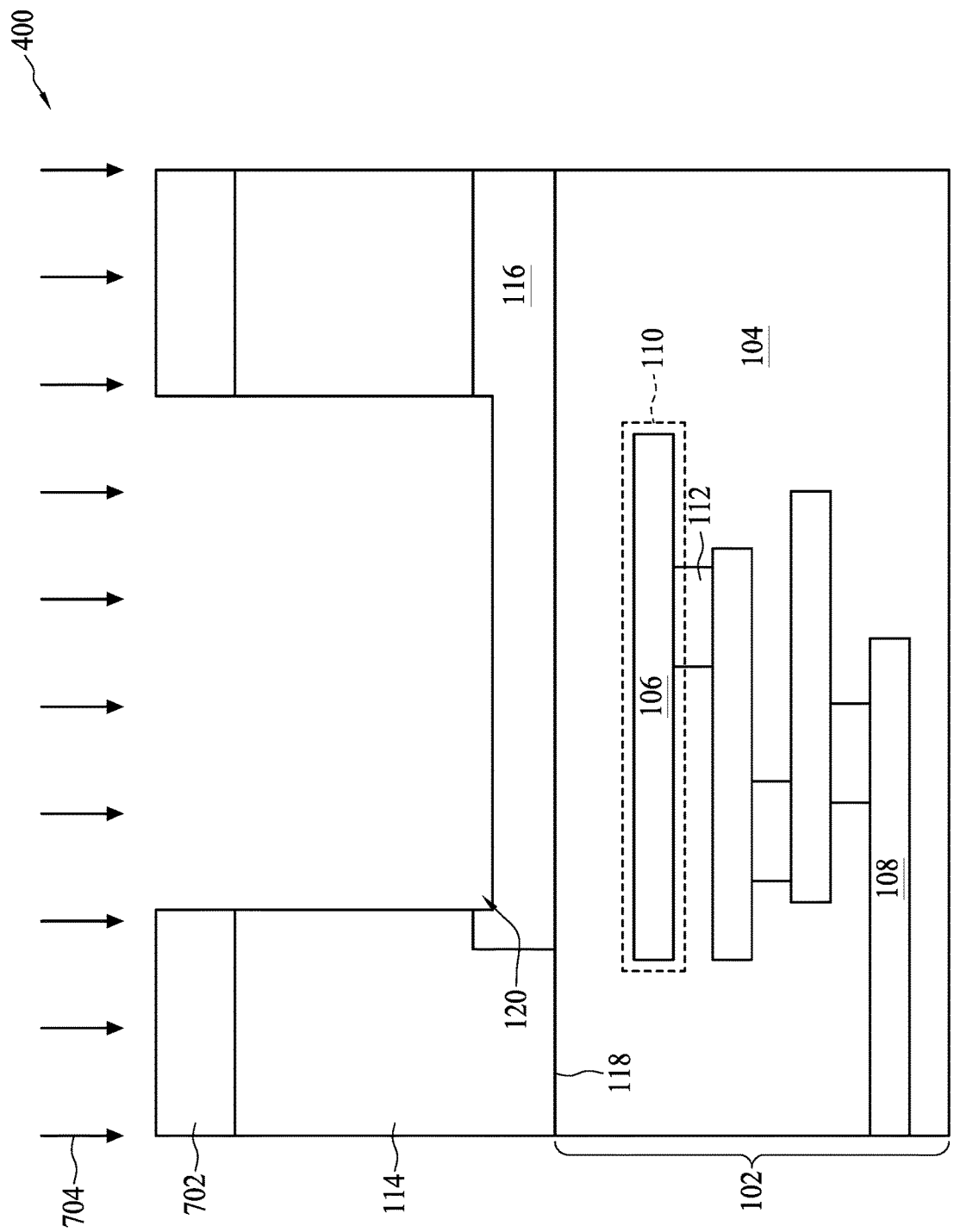

As illustrated in FIG. 4, a first etch is performed into the semiconductor substrate 114 to the isolation region 116. In some embodiments, due to over etching, the isolation region 116 may be eroded. The first etch results in a scribe line opening 120 overlying a metal line 110 and arranged in a remaining semiconductor substrate 114 and, in some embodiments, a remaining isolation region 116. Although not shown, the scribe line opening 120 typically extends laterally around an array of pixel sensors (e.g., see FIG. 2). The process for performing the first etch may include forming a first photoresist layer 702 masking regions of the semiconductor substrate 114 laterally surrounding the select region. Further, a first etchant 704 may be applied to the semiconductor substrate 114 according to a pattern of the first photoresist layer 702. Thereafter, the first photoresist layer 702 may be removed.

Figure 5:
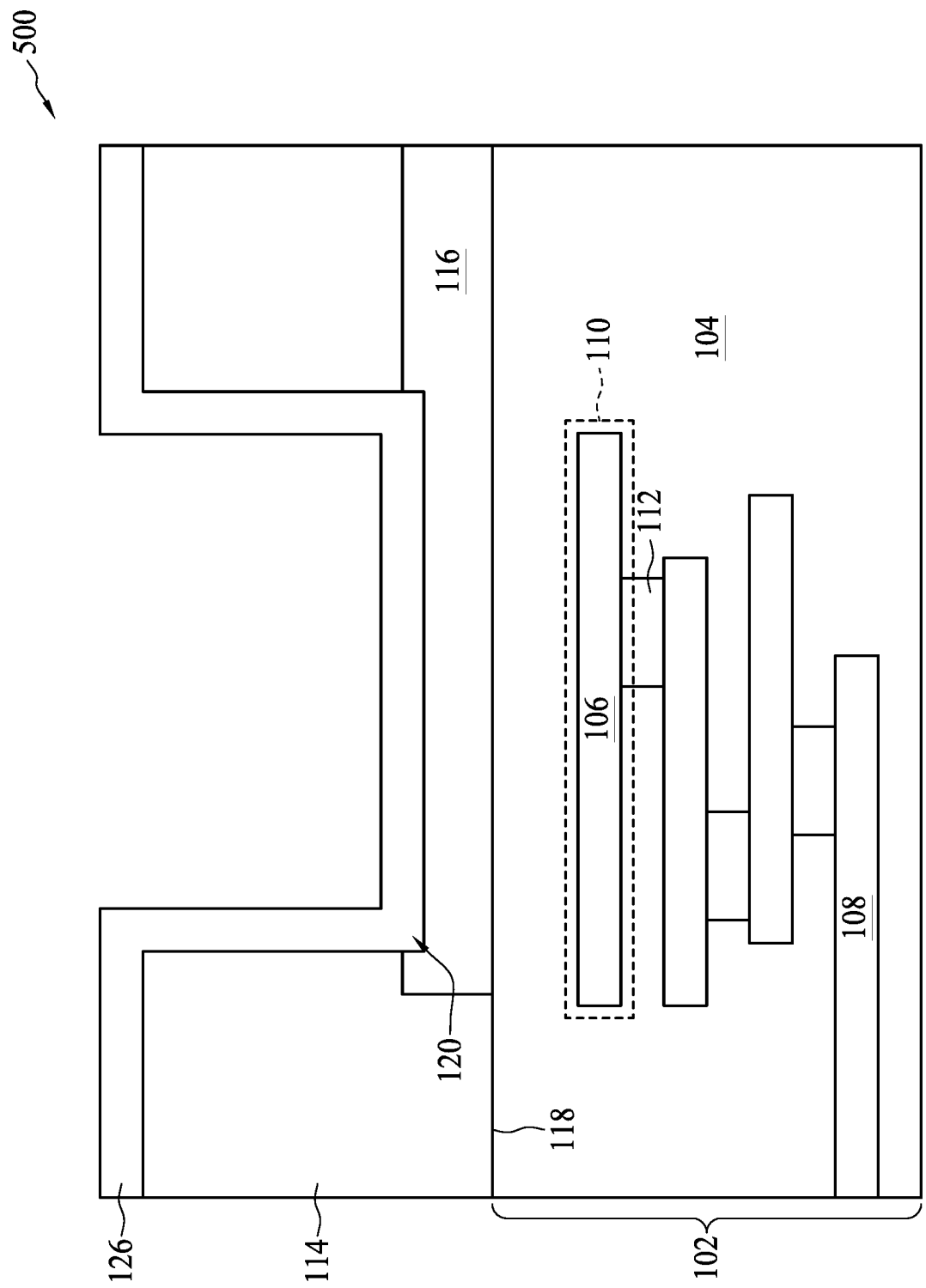

As illustrated in FIG. 5, a buffer layer 126 is formed over the semiconductor substrate 114 and lining the scribe line opening 120. The buffer layer 126 may be formed using vapor deposition (e.g., chemical vapor deposition (CVD)), thermal oxidation, spin coating, or any other suitable deposition technique. However, the buffer layer 126 is typically formed conformally. Further, the buffer layer 126 may be formed as, for example, an oxide, such as silicon dioxide.

Figure 6:
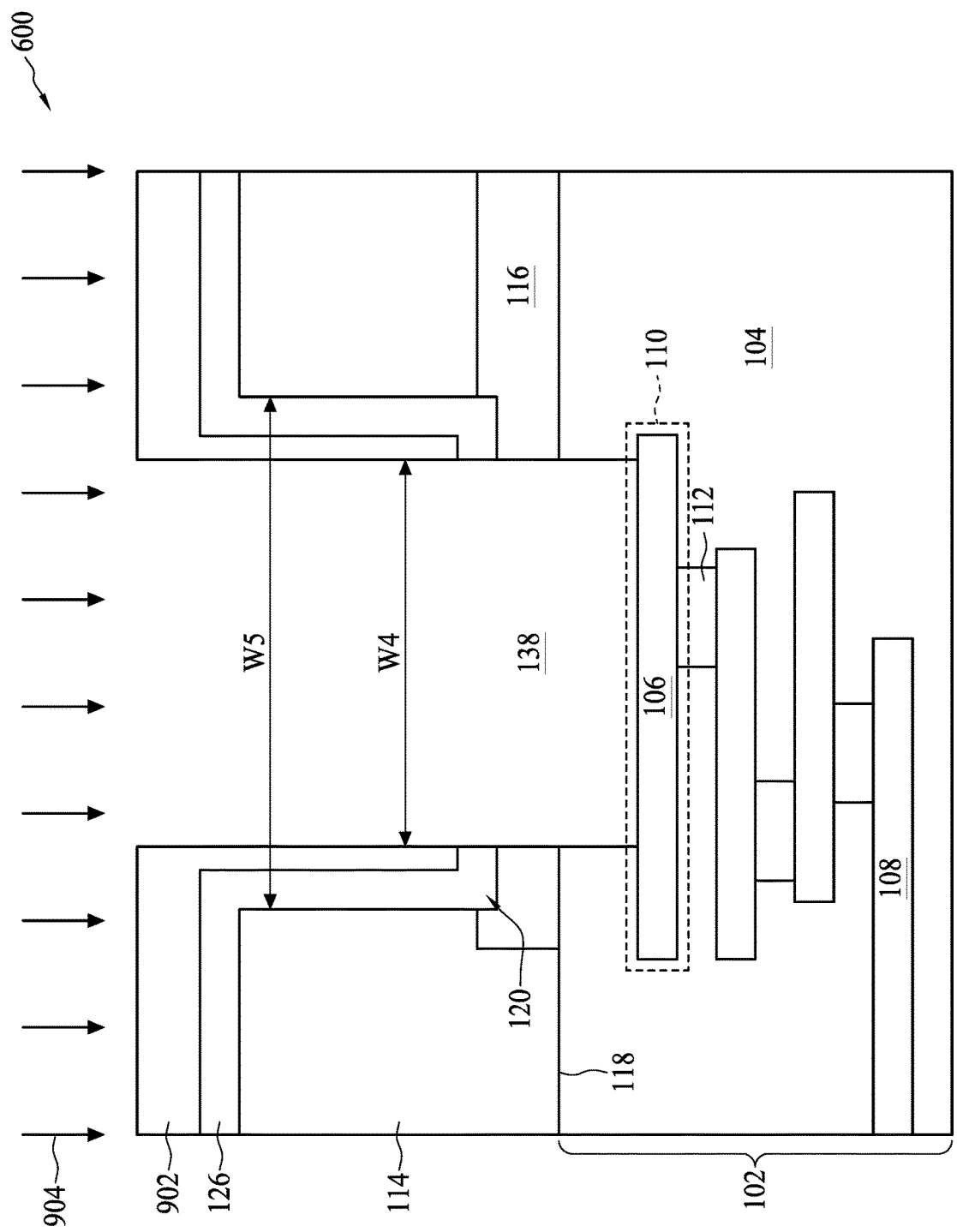

As illustrated in FIG. 6, a second etch is performed into the buffer layer 126, the isolation region 116, and the ILD layer 104, through a select region, to the metal line 110. The select region extends along the scribe line opening 120, and the select region may have a width W4 narrower than a width W5 of the scribe line opening 120. The second etch results in a pad opening 138 overlying the metal line 110. The pad opening 138 extends through a remaining buffer layer 126, a remaining isolation region 116, and an upper surface 118 of a remaining ILD layer 104, into the remaining ILD layer 104. The process for performing the second etch may include forming a second photoresist layer 902 masking regions of the buffer layer 126 laterally surrounding the select regions. The select region includes a width narrow than that of the scribe line opening 120. Further, one or more second etchants 904 may be applied to the buffer layer 126, the isolation region 116, and the ILD layer 104 according to a pattern of the second photoresist layer 902. Thereafter, the second photoresist layer 902 may be removed.

Figure 7:
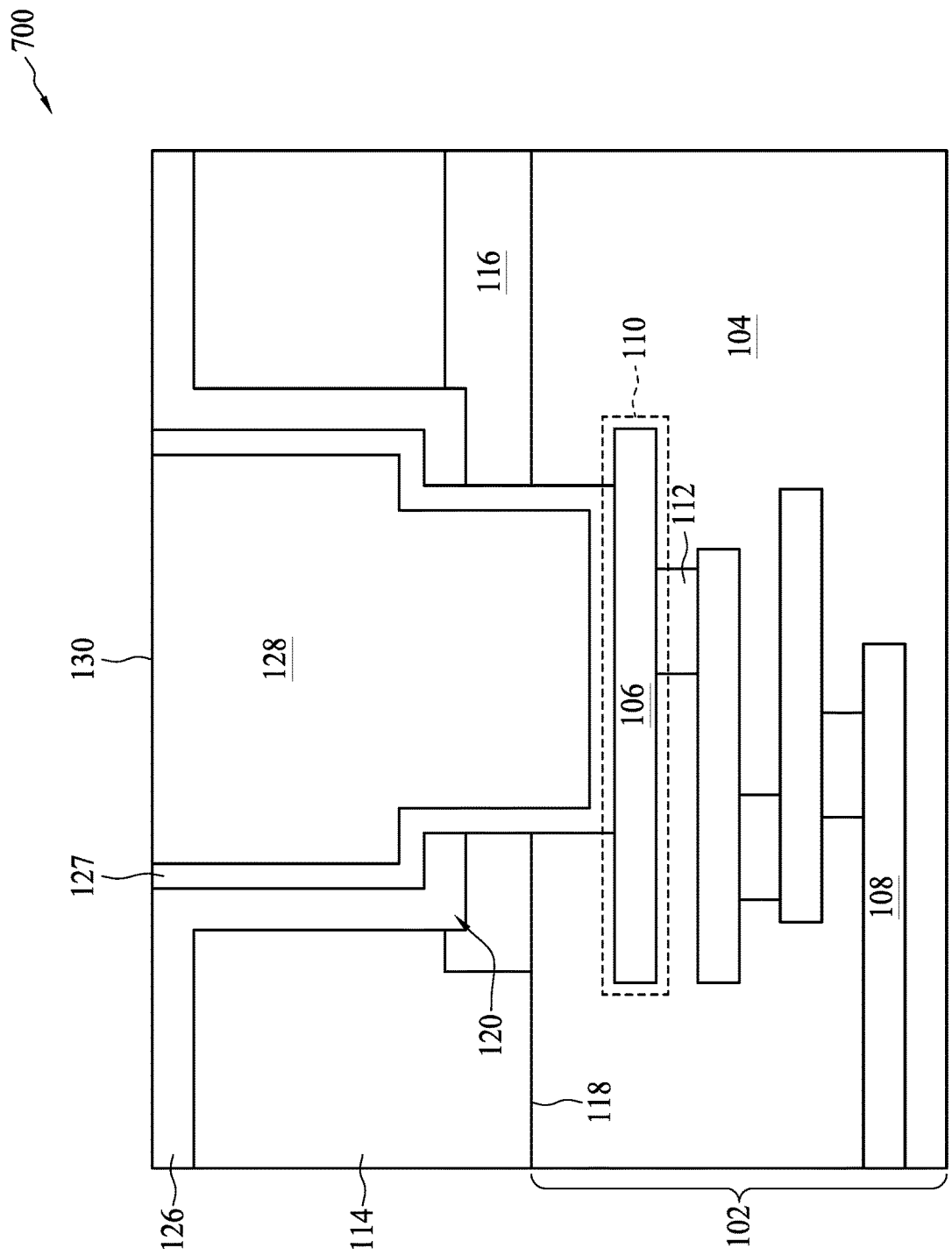

As illustrated in FIG. 7, a barrier layer 127 is conformally formed over sidewalls and a bottom of the pad opening 138 (shown in FIG. 6). The barrier layer 127 may include at least one layer of TaN, TiN, WN, TbN, VN, ZrN, CrN, WC, WN, WCN, NbN, AlN, or combinations thereof. The pad opening 138 is then filled by conductive materials, for example, a metal, such as copper to form a pad 128. In some embodiments, the process for forming the pad 128 may include conformally forming a seed layer lining the pad openings 138 and over the barrier layer 127. Thereafter, the pad 128 may be grown from the seed layer using a plating process (e.g., an electro-plating process or an electro-less plating process). Thereafter, a CMP may be performed to form the flat pad structure as shown in FIG. 7.

Figure 8:
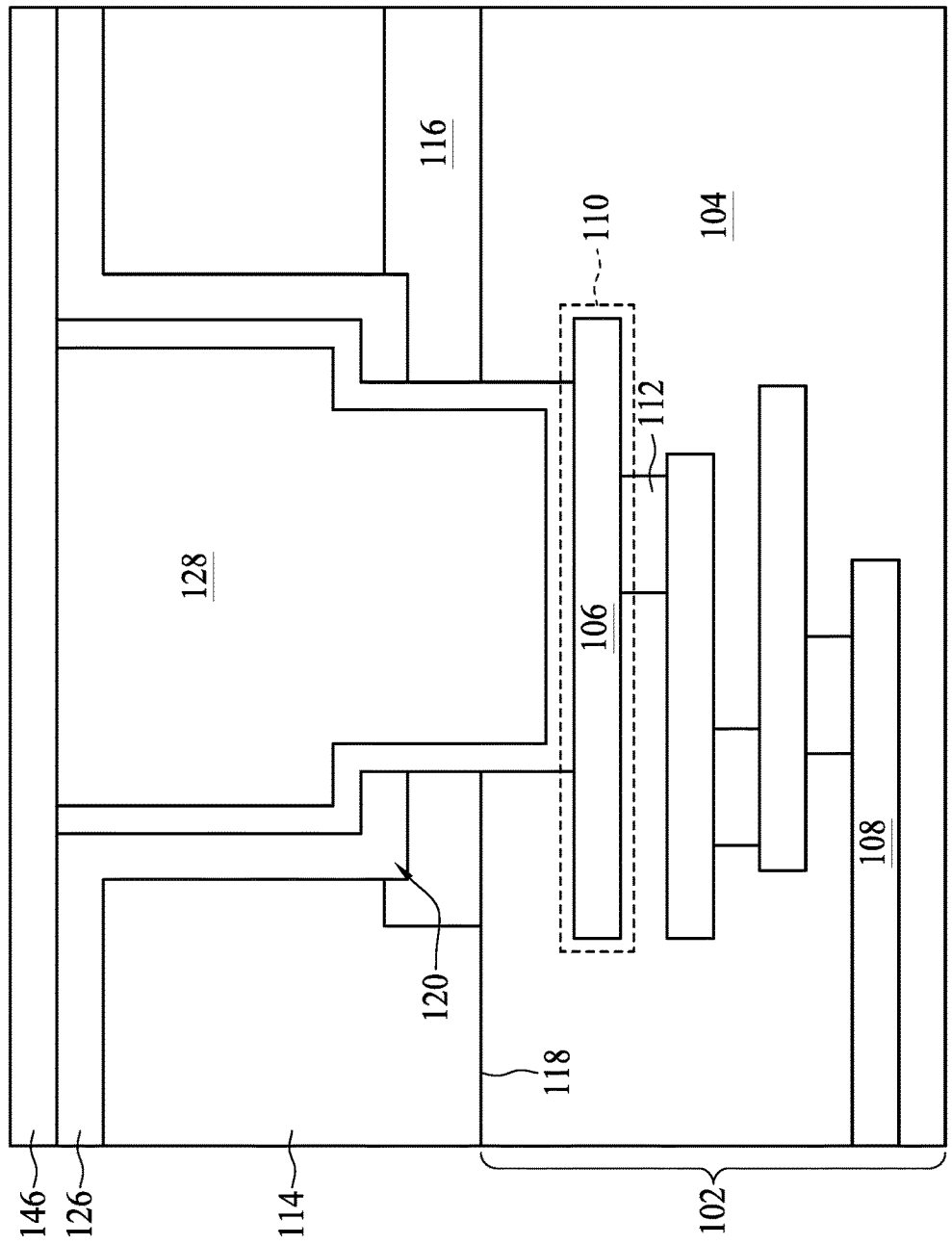

As illustrated in FIG. 8, a passivation layer 146 is formed over the semiconductor substrate 114, and lines over an upper surface of the buffer layer 126, the barrier layer 127 and the pad 128. Advantageously, by forming the passivation layer 146 after forming the pad 128, passivation layer damage (e.g., due to the CMP) is eliminated. The passivation layer cannot be damaged from the pad and dielectric layer formation as existing structures, since the passivation layer 146 is not formed until after the pad formation. In some embodiments, a BCFA is hereafter formed in the passivation layer. In some embodiments, the passivation layer 146 may be, for example, a single or multilayer dielectric film including one or more layers of: oxide, such as silicon dioxide; nitride, such as silicon nitride; and high k dielectric (i.e., dielectric with a dielectric constant greater than about 3.9). In some embodiments, the passivation layer 146 includes a nitride layer arranged over a pair of oxide layers, which are stacked on opposing sides of a high k dielectric layer. In other embodiments, the passivation layer 146 includes a nitride layer arranged over an oxide layer.

Figure 9:
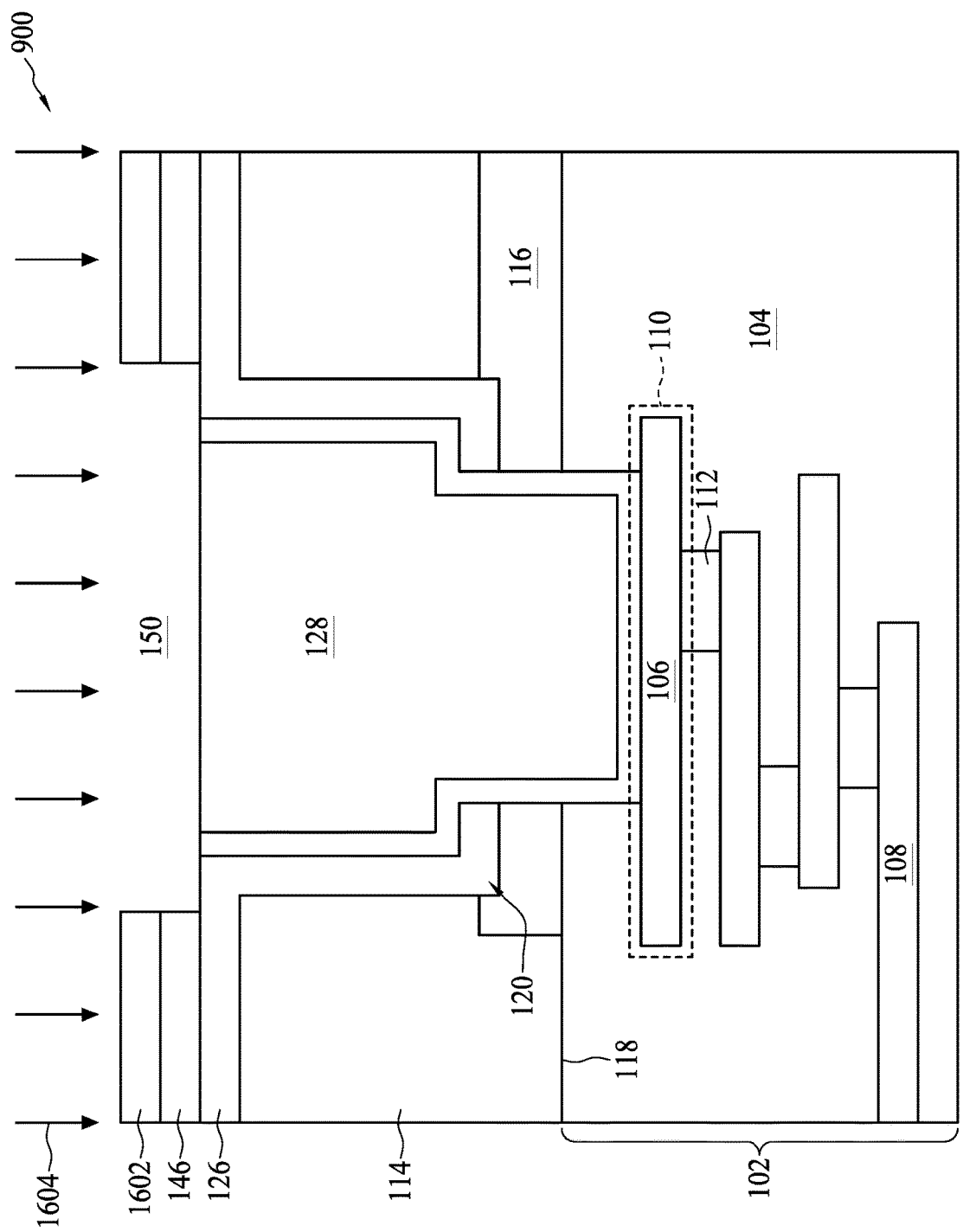

As illustrated in FIG. 9, an etch is performed into the passivation layer 146, through select regions overlying the pad 128. The etch results in an upper pad opening 150 overlying and exposing the pad 128. The process for performing the etch may include forming a photoresist layer 1602 masking regions of the passivation layer 146 laterally surrounding the select regions. Further, an etchant 1604 may be applied to the passivation layer 146 according to a pattern of the photoresist layer 1602. Thereafter, the photoresist layer 1602 may be removed.

A metal connect layer may be formed over the passivation layer 146 and filling the pad opening 150 in subsequent acts in order to allow the BSI image sensor to couple to external circuits. For example, the metal connect layer may be formed as a metal, such as copper or aluminum copper. Further, the metal connect layer may be formed using, for example, vapor deposition, thermal oxidation, spin coating, or any other suitable deposition technique.

Some embodiment of the present disclosure provides a semiconductor structure, including: a semiconductor substrate arranged over a back end of line (BEOL) metallization stack, and including a scribe line opening; a conductive pad having an upper surface that is substantially flush with an upper surface of the semiconductor substrate, the conductive pad including an upper conductive region and a lower conductive region, the upper conductive region being confined to the scribe line opening substantially from the upper surface of the semiconductor substrate to a bottom of the scribe line opening, and the lower conductive region protruding downward from the upper conductive region, through the BEOL metallization stack; a passivation layer arranged over the semiconductor substrate; and an array of pixel sensors arranged in the semiconductor substrate adjacent to the conductive pad.

Some embodiment of the present disclosure provides a A back-side illuminated (BSI) image sensor, including: a back end of line (BEOL) metallization stack; a semiconductor substrate arranged over the BEOL metallization stack, the semiconductor substrate including: a sensing region arranged at a center of the BSI image sensor, the sensing region being configured to sense incident radiation; an interconnect region laterally surrounding the sensing region along an edge of the BSI image sensor, the interconnect region including a scribe line opening and a conductive pad having an upper surface that is substantially flush with an upper surface of the semiconductor substrate; and a logic region laterally surrounding the sensing region between the sensing region and the interconnect region, the logic region including logic devices configured to support operation of the BSI image sensor.

Some embodiment of the present disclosure provides a A method for manufacturing a semiconductor structure, including: providing a semiconductor substrate and an isolation region arranged over and abutting a back end of line (BEOL) metallization stack; performing a first etch upon the semiconductor substrate to form a scribe line opening; forming a buffer layer over the semiconductor substrate and lining the scribe line opening; performing a second etch upon the buffer layer, the isolation region, and the BEOL metallization stack to form a pad opening; and filling the pad opening with a conductive material.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a semiconductor structure, comprising:
    performing a first etch upon a semiconductor substrate to form a scribe line opening;
    performing a second etch in the scribe line opening to form a pad opening, wherein the pad opening includes an upper region and a lower region, the upper region being confined to the scribe line opening substantially from an upper surface of the semiconductor substrate to a bottom of the scribe line opening, and the lower region protruding downward from the upper region, through an isolation region; and
    filling the pad opening with a conductive material.

2. The method of claim 1, further comprising: forming an array of pixel sensors.

3. The method of claim 2, wherein the scribe line opening extends laterally around the array of pixel sensors.

4. The method of claim 1, further comprising: depositing a buffer layer lines sidewalls of the scribe line opening.

5. The method of claim 1, wherein the isolation region extends into the semiconductor substrate.

6. The method of claim 1, further comprising: forming a passivation layer over the semiconductor substrate.

7. The method of claim 4, wherein the deposition of the buffer layer further comprises: depositing the buffer layer to line the upper surface of the semiconductor substrate and the bottom of the scribe line opening.

8. The method of claim 1, wherein a width of the upper region of the pad opening is greater than a width of the lower region of the pad opening.

9. A method for manufacturing a semiconductor structure, comprising:
    performing a first etch upon a top surface of a semiconductor substrate to form a scribe line opening, wherein an isolation region is embedded in the semiconductor substrate and neighboring to a bottom surface of the semiconductor substrate, and a portion of the semiconductor substrate and a portion of the isolation region are etched by the first etch, thereby exposing the isolation region;
    depositing a buffer layer lining the top surface of the semiconductor substrate and the scribe line opening;
    performing a second etch in the scribe line opening to etch through the semiconductor structure, the buffer layer, and the isolation region; and
    filling the pad opening with a conductive material.

10. The method of claim 9, wherein the performing the second etch comprises:
    performing the second etch in the scribe line opening through a select region to further etch through a portion of a back end of line (BEOL) metallization stack to form a pad opening.

11. The method of claim 10, wherein a width of the select region is narrower than a width of the scribe line opening.

12. The method of claim 11, wherein the select region is centered on a center of the scribe line opening.

13. The method of claim 9, further comprising: forming a passivation layer over the semiconductor substrate.

14. The method of claim 9, wherein the deposition of the buffer layer comprises:
    depositing the buffer layer to line sidewalls and a bottom of the scribe line opening.

15. The method of claim 13, wherein the passivation includes silicon nitride.

16. The method of claim 9, wherein the filling the pad opening with the conductive material comprises:
    conformally forming a barrier layer over sidewalls and a bottom of the pad opening.

17. The method of claim 16, wherein the filling the pad opening with the conductive material further comprises:
    filling the pad opening with copper.

18. A method for manufacturing a semiconductor structure, comprising:
    performing a first etch upon a semiconductor substrate to form a scribe line opening;
    forming a buffer layer over the semiconductor substrate and lining the scribe line opening;
    performing a second etch upon the buffer layer, an isolation region, and a back end of line (BEOL) metallization stack to form a pad opening; and
    filling the pad opening with a conductive material.

19. The method of claim 18, wherein the performing the second etch upon the buffer layer, the isolation region, and the BEOL metallization stack to form the pad opening comprises:
    performing the second etch upon the buffer layer, the isolation region, and the BEOL metallization stack to form the pad opening through a select region, the select region extending along the scribe line opening, the select region has a width narrower than that of the scribe line opening.

20. The method of claim 19, wherein the select region is centered on a center of the scribe line opening.

* * * * *